United States Patent [19]
Norden

[11] Patent Number: 4,482,938
[45] Date of Patent: Nov. 13, 1984

[54] ELECTRICAL APPARATUS WITH PLUG-IN MODULES

[76] Inventor: Alexander R. Norden, 350 Central Park West, New York, N.Y. 10025

[21] Appl. No.: 412,179

[22] Filed: Aug. 27, 1982

[51] Int. Cl.$^3$ ............................................. H05K 7/10
[52] U.S. Cl. ................................. 361/426; 361/394; 361/415; 339/18 B
[58] Field of Search .................... 339/18 R, 18 B, 65, 339/66 R; 179/91 R, 98; 361/338–340, 390, 391, 393–395, 415, 425, 426

[56] References Cited

U.S. PATENT DOCUMENTS

| | | | |
|---|---|---|---|
| 3,853,379 | 12/1974 | Goodman | 361/391 |
| 4,214,291 | 7/1980 | Koshman | 361/340 |
| 4,247,882 | 1/1981 | Pragger | 361/426 |
| 4,334,261 | 1/1982 | Gonzales | 361/426 |

Primary Examiner—G. P. Tolin

[57] ABSTRACT

The disclosed apparatus involves circuit modules paired with companion terminal assemblies alongside each other in an enclosure. The circuit modules are operable along front-to-back paths for installation in the enclosure and removal. The terminal assemblies are also operable along front-to-back paths but at a slant angle to the paths of the circuit modules. The sides of each circuit module and its companion terminal assembly have mating contacts that are in engagement in the operative condition of the terminal assembly and the adjacent circuit module. As a terminal assembly is moved forward or raised from its installed or operative condition, its contacts have a sidewise component of movement that carry them out of the paths of the module contacts, so that the module can be removed and installed with ease. The apparatus can be wired from the front when each terminal assembly is in its raised condition. Interlock means enforces certain sequential operations of the circuit modules and the terminal assemblies.

19 Claims, 15 Drawing Figures

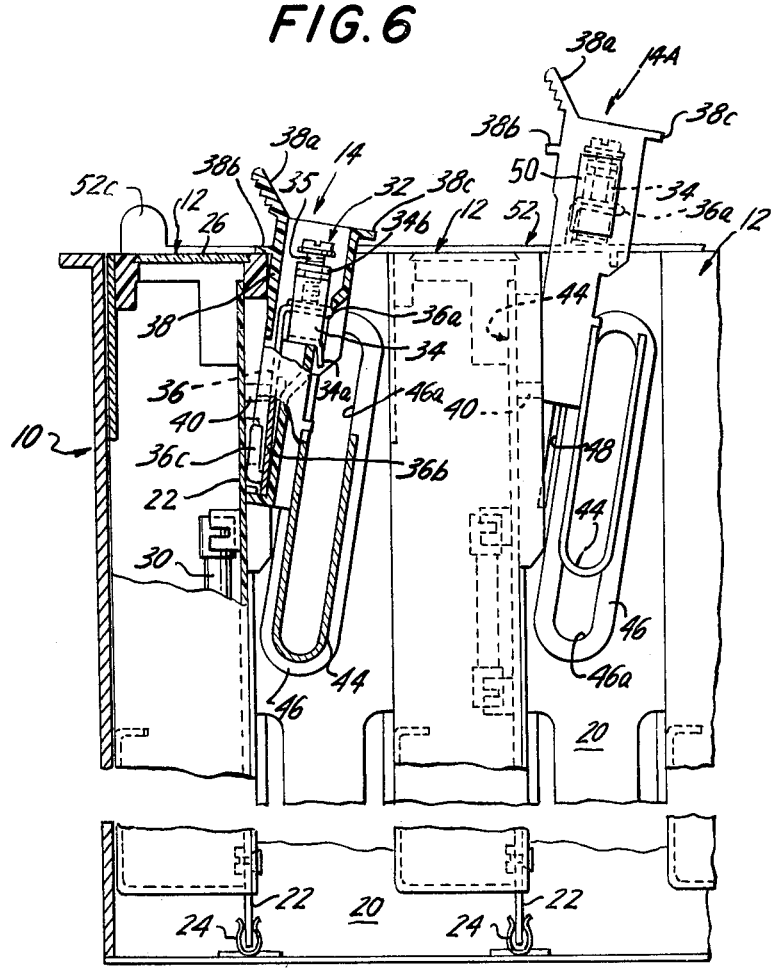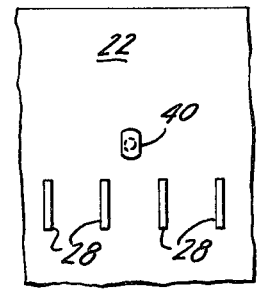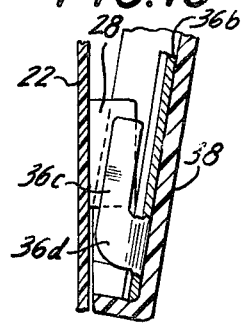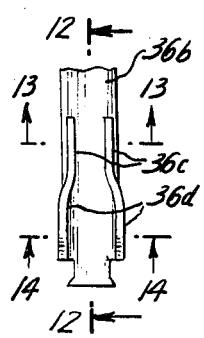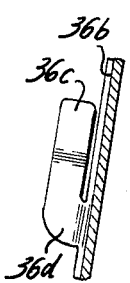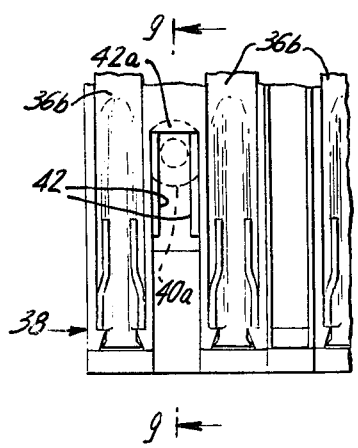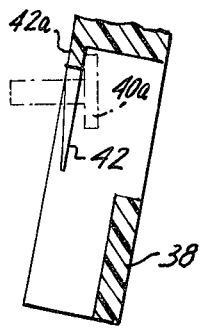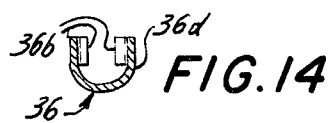

ELECTRICAL APPARATUS WITH PLUG-IN MODULES

The present invention relates to electrical apparatus having circuit modules and companion terminal assemblies.

In a long established practice, circuit modules have been designed to be removed from assembled electrical equipment and replaced readily, as for repairing or altering the equipment. In particular, the circuit modules may be part of a programmed control system that responds to input signals (as from condition-sensing devices) and provides operating control for diverse electromechanical equipment. The system involves connections from the control modules to external circuits of the controlled equipment. The modular apparatus incorporates terminal assemblies for providing connections from the control modules to signal input circuits, to energizing supplies, and to controlled apparatus.

An object of this invention resides in improving modular electrical apparatus having circuit modules and companion terminal assemblies. More specifically, an object of the invention resides in providing novel electrical apparatus having readily installed and replaced circuit modules and companion terminal assemblies that provide connection from the circuit modules to external circuits, wherein the wiring of the terminal assemblies can be performed at the same area (conveniently called the "front" of the apparatus) where the circuit modules are displayed and at which the circuit modules are accessible for installation and removal. A related object resides in providing novel apparatus of this kind wherein circuit modules and companion terminal assemblies are compactly assembled and utilize the front area of the apparatus efficiently.

A further object of the invention resides in providing a novel assembly of circuit modules and companion terminal assemblies that have mating contacts wherein the terminal assemblies can be wired, manipulated readily and tested, even though access may be limited to the front of the apparatus.

A further object resides in providing novel assembled modular circuit apparatus wherein manipulation of terminal assemblies and circuit modules is controlled and coordinated by interlocks that ensure their sequential manipulations. This sequence of operations may be devised for facilitating installation and removal of the circuit modules, or for foreclosing possible damage to one another, or both, and for facilitating wiring of the terminal assemblies. A further object resides in providing novel interlock means for the foregoing purposes and for retaining the circuit modules securely in their operative positions.

These and other objects are achieved in the illustrative modular assembly described below and shown in the accompanying drawings. Briefly, circuit modules and companion terminal assemblies adjacent the circuit modules are assembled in an enclosure, such that the circuit modules can be installed and removed from the "front" of the electrical apparatus. The terminal assemblies can be manipulated for connecting them to the circuit modules and disconnecting them, and for wiring them, all such manipulations being performed at the front of the assembly.

The circuit modules are guided for movement along parallel paths into and out of the assembly at its front. Each terminal assembly is also operable along a controlled path between a "forward" or "raised" position wherein it is disconnected from its companion circuit module and an "operating" position wherein each installed circuit module and its companion terminal assembly are connected by mating contacts. The terminal assembly is guided for movement along a path that is at a slant angle to the in-and-out path of its companion circuit module, such that the terminal assembly has a component of motion laterally away from its companion circuit module as it is moved to its forward or raised position from its operating position. In moving the terminal assembly forward, its contacts are parted from mating contacts of the installed companion circuit module. Additionally, due to the "slant angle" of the terminal assembly's path relative to that of the circuit module, the lateral shift of the entire terminal assembly frees the circuit module to be moved along its prescribed path. With the terminal assembly raised, in-and-out movement of the circuit module is unobstructed and unimpeded. While a circuit module is being moved in or out, the contacts of the companion terminal assembly remain in positions having clearance from the corresponding contacts of the circuit module being moved in or out. Consequently, there is no concern for damage being caused to the companion contacts of the circuit module and the terminal assembly during their in-and-out shifts, nor is there danger of damage to circuits due to random engagement of some module contacts with corresponding contacts of a terminal assembly that is only partly raised.

Ordinarily the circuit modules have their own plug-in contacts for engaging and disengagement from companion contacts in the apparatus. The circuit module commonly has "edge" contacts on a printed circuit board. In-and-out movement of the circuit module is facilitated by providing each circuit module and its terminal assembly with mating contacts that remain disengaged and mutually non-interfering during the in-and-out movement of the circuit module. A terminal assembly that is "raised" can be moved "in" to its operating position while the circuit module is installed in its operating position, their related contacts becoming engaged during this operation.

As a separate feature, the terminal assemblies have terminals that are accessible from the front of the assembly for test purposes. Further, the terminal assemblies have terminals that can be readily wired from the front of the apparatus while the terminal assembly is in its forward or raised position. Detents are provided for holding the terminal assemblies raised securely to facilitate wiring.

As a further and separate feature, interlock means is provided for several purposes. In the illustrative apparatus detailed below, the control modules are held securely in operative position by the companion terminal assemblies, and an interlock slide in one position retains the terminal assemblies in their operative position. Thus the circuit modules and the terminal assemblies are jointly secured in their operative positions. When the interlock slide is shifted, each released terminal assembly can be raised out of its operative position. When this is done, a circuit module is no longer retained in its operative position by its companion terminal assembly. However, when the interlock slide releases the terminal assemblies so that they can be raised, the interlock side shifts so as to maintain the circuit modules locked in their operative positions. Only when a terminal assembly has been shifted fully to its raised position can the interlock slide be shifted to lock the shifted terminal assembly in its forward position. Its companion circuit module can then be removed since it is no longer detained either by its companion terminal assembly or by the interlock slide.

By like token, a circuit module can be inserted only while its companion terminal assembly is held by the interlock slide in its fully raised position. A circuit module cannot be inserted when its companion terminal assembly is in its operative position because the terminal assembly obstructs the insertion path of the circuit module. The interlock slide must first be shifted to release the companion terminal assembly and in that condition the interlock slide obstructs installation of a circuit module. Only when the terminal assembly has been fully raised and the interlock slide has been shifted to lock the terminal assembly in its fully raised position can a circuit module be installed.

Because of the interlock, a terminal assembly must be secured in such a position as not to interfere with the free fore-and-aft movement of its companion circuit module. This feature is of particular benefit where the circuit module has its own plug-in contacts, and where the terminal assembly has contacts that move into secure engagement with mating contacts of its companion circuit module. When the circuit module is unencumbered by engagement of its contacts with the mating contacts of the terminal assembly, it is relatively easily manipulated for removal and for installation. In a separate operation, the terminal assembly can be moved from its fully raised position to its operative position only when a circuit module has been installed fully, or when it has been removed. Faulty and potentially damaging manipulations are forestalled.

In its full detail, the interlock system thus provides unique benefits. Less than the whole system also imparts certain benefits. For example, the interlock slide remains available when needed for locking a selected terminal assembly "raised" and with its screw terminal in easy access for insertion of a wire and for securing the wire in place. By virtue of this feature, the assembled apparatus can be wired even when access is limited to the front of the apparatus. It is at this front of the apparatus that the circuit modules commonly have display indicia and signal lights. Quite apart from the lights and indicia, it is at the front of the apparatus where access is afforded for removal and installation of the circuit modules. The terminal assemblies of the illustrative apparatus also provide access at the "front" for test purposes and for wiring.

The interlock guards against a further dangerous condition. When the terminal assembly is fully raised, its contacts have shifted laterally into clearance positions safely out of the in-and-out paths of the circuit module's mating contacts. It may be imagined that a terminal assembly is raised only partway to its raised position so that its contacts have moved laterally only partway to their clearance positions. A circuit module might then be inserted and moved to its fully installed position. During that movement, some of the contacts of the circuit module might, at random, brush against mating contacts of the terminal assembly. The resulting unpredicted connections to only some of the module's contacts could cause circuit damage. The interlock forestalls that condition by insuring shift of each terminal assembly to its fully raised position, thus insuring full lateral shift of its contacts into their clearance positions before the circuit module can be inserted.

The nature of the invention in its various aspects, and its further novel features and advantages, will be better appreciated from the following detailed description of an illustrative embodiment and from the accompanying drawings forming part of the disclosure of the illustrative embodiment.

In the drawings:

FIG. 6 is a fragmentary view corresponding to FIG. 2, partly in cross-section, drawn to larger scale than FIG. 2;

FIG. 7 is a fragmentary detail of one of the plug-in modules (components of the illustrative embodiment) as viewed from the right of FIG. 6;

FIG. 8 is a fragmentary detail of one of the terminal assemblies in FIGS. 1, 2 and 6 as viewed from the left of FIG. 6, drawn to larger scale than FIG. 6;

FIG. 9 is a fragmentary cross-section at the plane 9—9 in FIG. 8;

FIG. 10 is a fragmentary cross-section of mating contacts, being parts shown severally in FIGS. 7 and 8, as viewed at the plane 9—9 in FIG. 8;

FIG. 11 is a fragmentary view of a typical contact of the terminal assembly, the contact being an element in FIG. 8 but drawn to larger scale;

FIG. 12 is a fragmentary cross-section of a contact shown in FIG. 11 at the plane 12—12 therein;

Figure 1:
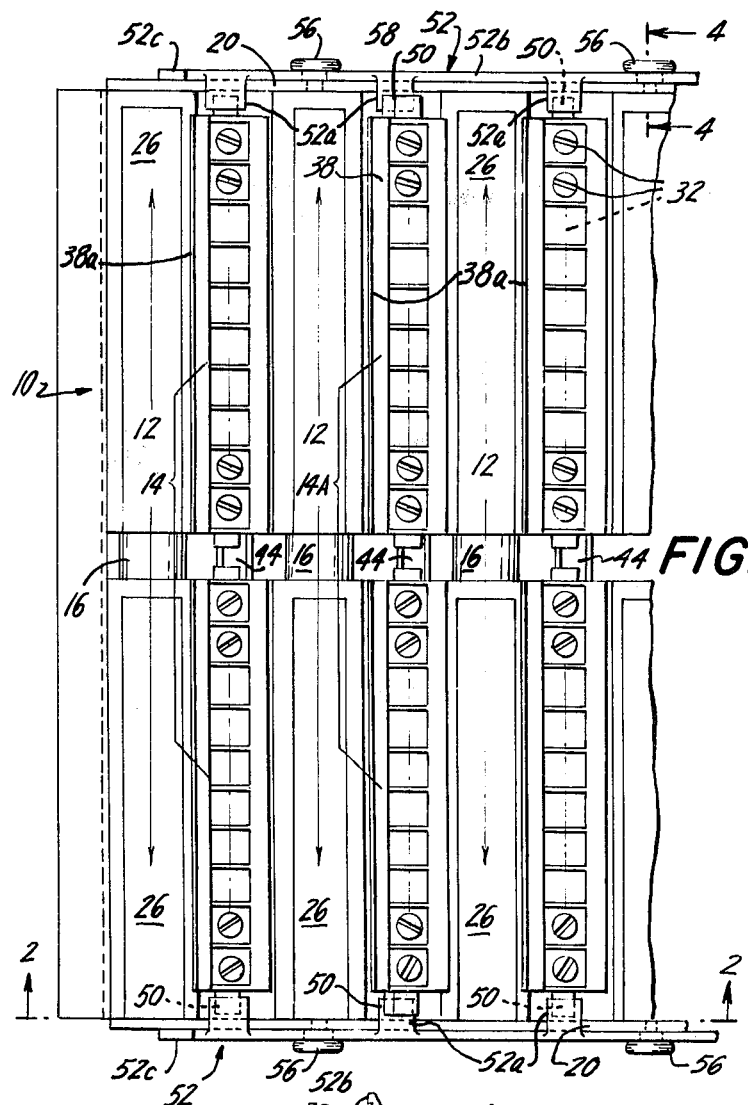
FIG. 1 is a fragmentary front view of an illustrative embodiment of the invention in its various aspects.

FIGS. 13 and 14 are cross-sections of the contact of FIG. 11 at the planes 13—13 and 14—14 therein.

Referring to the drawings, an enclosure 10 is shown containing a series of plug-in circuit or programmable control modules 12 and a series of terminal assemblies 14. Most of the terminal assemblies are shown in their plugged-in positions, but terminal assembly 14A is shown in its un-plugged position, raised in FIGS. 2 and 6.

Figure 2:
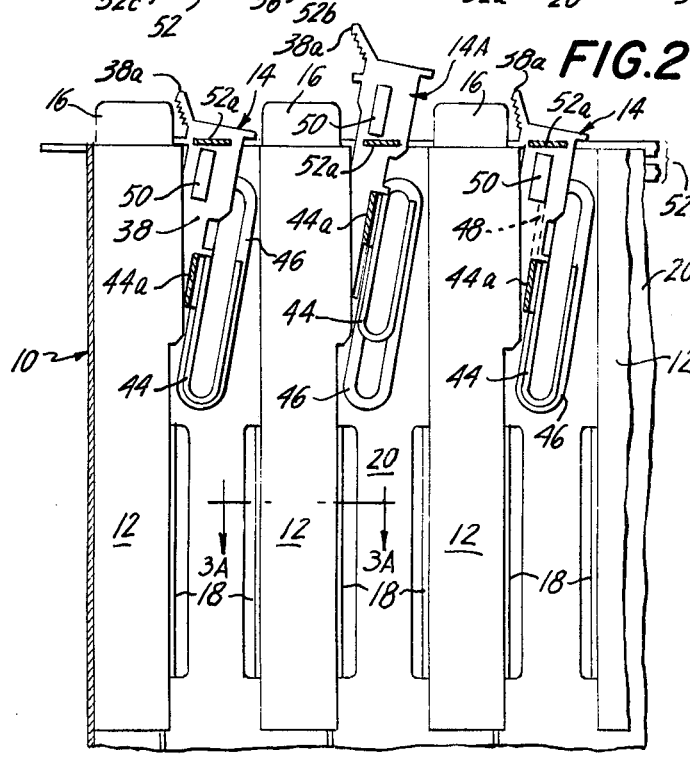
FIG. 2 is a fragmentary elevation of the illustrative embodiment, partially in cross-section, at the plane 2—2 in FIG. 1.

Each control module 12 has a handle 16, enabling the module to be pulled away from the front of the apparatus, upward as viewed in FIG. 2. Elongated guides 18 are struck out of walls 20 of the enclosure. These guides cooperate with the circuit modules 12 to determine the paths of the modules when being installed in and removed from the enclosure. Each module has a printed-circuit board 22 (FIGS. 6 and 7) bearing edge contacts that are received and gripped between respective resilient pairs of plug-in contacts 24 of a so-called "mother" board at the back of the enclosure. Control signals as from programming circuits and sensing devices are impressed on the control modules via contacts 24, and these contacts serve also to interconnect the control modules.

The front face of each circuit module 12 has a window 26. Indicia on the window and indicating lamps behind selected ones of the indicia are aligned with respective contacts 28 (FIG. 7) on printed-circuit board 22.

Controlled currents can be conducted by the terminal contacts 28 of each module, optionally through fuses 30. The current capacity of contacts 28 is high, e.g. up to 10 Amperes, compared to the low signal currents at the edge contacts of the printed circuit boards 22 engaged by contacts 24.

A screw-terminal 32 in each assembly 14 is provided for each of the contacts 28 of its companion plug-in control module 12. Indicia and/or a lamp of module 12 is opposite some terminals 32 of the terminal assembly. Each screw terminal includes a four-sided collar 34 of sheet metal having a bottom with a lateral depending lip 34a (FIG. 6). At its top, collar 34 has a double-thickness wall 34b that is screw-threaded and receives a screw 35. As seen in FIGS. 6, 8 and 10–14, each screw terminal 32 includes a one-piece contact element 36 comprising a double-thickness top portion 36a that extends into and across collar 34, an elongated connecting spine 36b, and a pair of resilient contacts 36c. These contacts are spaced narrowly from each other. Upstanding portions 36d are spaced farther apart than contact pairs 36c, portions 36c and 36d being connected by sloping ramps.

Each element 36 is suitably anchored in a body 38 of molded electrical insulation. With the terminal assembly 14 raised (see terminal assembly 14A in FIG. 6) an external circuit wire is inserted in the opening (at the right, FIG. 6) below portion 36a and above the bottom of collar 34. After a wire has been inserted, screw 35 is tightened against contact portion 36a to draw collar 34 up and clamp the inserted wire against contact portion 36a. The wire is bent into and along a wiring gutter, described below.

Each plug-in module has a series of fixed posts 40 (which may be shouldered rivets) spaced apart in a row parallel to contacts 28. Only one such post appears in FIGS. 6 and 7. One such post is also shown in phantom in FIGS. 8 and 9. For each post, insulating body 38 has a pair of parallel spaced shoulders or ramps 42 terminating at overhang 42a. The lower surface of post-head 40a coacts with ramps 42 and overhang 42a. As terminal assembly 14A is depressed, body 38 is constrained by posts 40 to guide its pairs of resilient contacts 36c into aligned sliding, gripping contact with respective module contacts 28. Posts 40 also pull insulating body 38 and its contact pairs toward the printed circuit board 22 and its contacts 28. This provision thus assures proper mating of contacts 28 and 36c despite possible warping and other dimensional variations of parts 22 and 38. Terminal assembly 14 comprises two elongated molded parts 38 each of which contains ten screw terminals 32 in this example. The two molded parts 38 are united by wiring gutter 44. The wiring gutter (here of metal) extends along the whole length of its terminal assembly, uniting the bodies 38. Wiring gutter 44 is fixed to each insulating body 38, conveniently by screws (not shown). One or each of the opposite pair of sheet-metal walls 20 of enclosure 10 (see FIGS. 2, 3 and 6) has an aperture opposite to the wiring gutter of each terminal assembly 14. Wiring from screw terminals 32 is trained along wiring gutter 44 and extends through grommets 46 in wall(s) 20. Opening 46a provided by each grommet is in alignment with its related wiring gutter both when the terminal assembly is raised and when it is depressed into its operative position.

Figure 5:
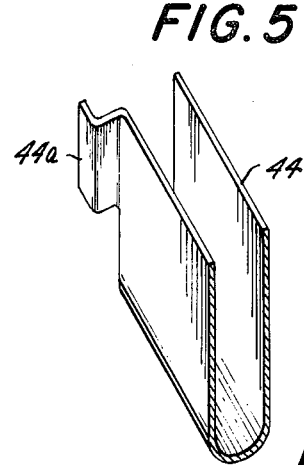
FIG. 5 is a fragmentary perspective of a wiring gutter, being a component of the apparatus shown in FIGS. 1 and 2.
Figure 3:
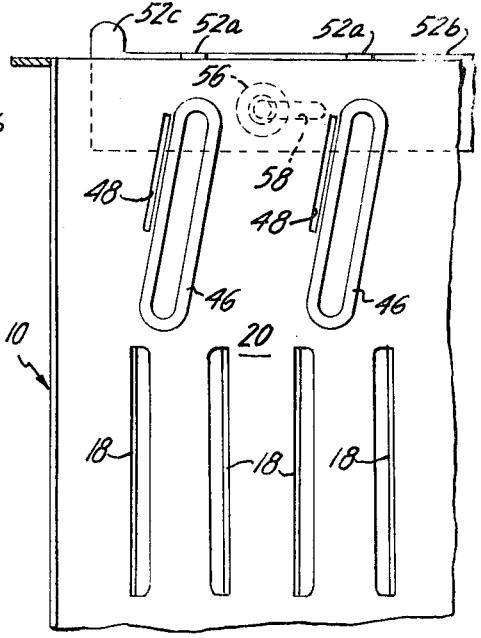
FIG. 3 is a fragmentary elevation of components of the illustrative embodiment, viewed as in FIG. 2 and shown partly in cross-section.

As seen in FIG. 5, the wiring gutter has an off-set rail 44a (one at each end) and the opposite walls 20 of the enclosure have slots 48 for all those rails (e.g. slots 48 in FIGS. 3 and 6) that constrain the in-and-out movement of the terminal assembly to follow a path which, here, is at a 10° angle in relation to the in-and-out path of the plug-in modules 12 along their guides 18 (FIG. 3). The side walls of the wiring gutter, as well as the sides of the opening 46a of each grommet 46, extend along this same angle. Manual effort is applied to upstanding handle 38a, for forcing plug-in terminal assembly in and out. Each handle 38a extends all along its body 38.

Rails 44a (FIG. 5) and the end-wall slots 48 provide rugged guiding means that is effective to absorb the main stresses during the plug-in and unplugging operations of the terminal assembly 14. As indicated above, each post 40 cooperates with ramps 42 and overhang 42a of body 38 of the terminal assembly for assuring accurate coaction between the resilient contact pairs 36c and module contacts 28. The terminal-assembly contacts 36c have a small component of motion toward and away from printed-circuit board 22 during in-and-out manipulation of the terminal assembly, and contacts 36c have a major component of motion parallel to the face of the printed-circuit board. Resilient contacts could be provided facing board 22, replacing contact pairs 36c, for engaging the right-hand ends (see FIG. 10) of contacts 28. However, the described form of contacts 36c is advantageous as being essentially independent of anticipated dimensional irregularities of board 22 and molded part 38, such as possible warping noted above.

As best seen at the left in FIG. 6, lateral ribs 38b extend along nearly all of terminal assembly 14 and overlie plug-in module 12 when the terminal assembly is plugged in. When the terminal assembly is pulled out (as represented at the right in FIG. 6) the slant angle of movement enforced by rails 44a and cooperating slots 48 serves to shift rib 38b a short distance to the right. This is enough to remove rib 38b from the plug-in and removal path of module 12 as constrained by its guides 18. Therefore each module 12 can be plugged-in and removed only while its companion terminal assembly 14 is in its raised position.

While terminal assembly 14 is being raised or pulled up, contacts 36c disengage module contacts 28. In this operation, contacts 36c also shift away from the plane of printed-circuit board 22 due to the slant path of terminal assembly 14. Thus contacts 28 become unencumbered and have a free path for inward and outward shift of circuit module 12 without being impeded by engagement of contacts 36c with module contacts 28. This attribute makes it easy to insert and remove modules 12. Were contacts 36c in the path of contacts 28 during insertion of a module 12, much greater effort would be needed. This is especially true where, as here, each of the many contact pairs 28/36c is proportioned for relatively firm contact pressure and high current.

Screw terminals 32 are accessible for test purposes from the "front", i.e., at the same face as the display window 26. The apparatus can also be wired from the front by raising the terminal assemblies until the space between the bottom of each collar 34 and contact portion 36a becomes accessible to receive the end of an inserted wire. See assembly 14A, FIG. 6. Because the lower portion of body 38 is relieved, an enlarged space develops between terminal assembly 14A (raised) and the next-adjacent module 12 for training wires along the wiring gutter. When the terminal assembly is pressed down (at the left, FIG. 6) rib 38c lies adjacent to the neighboring module 12 along nearly all of the module, to close the front of the structure.

Each terminal assembly 14 has a protrusion 50 at each end. An interlock 52 extends along each of two opposite walls 20 of enclosure 10, opposite the ends of the terminal assemblies. As seen at the top and the bottom of FIG. 1 and again in FIG. 2, fingers 52a (which extend integrally from slide 52b) can overlie or underlie respective protrusions 50. In its overlying condition, finger 52a locks a terminal assembly 14 in its fully plugged-in position. In turn, portion 38b of that plugged-in and locked terminal assembly serves to lock its companion module 12 in its plugged-in condition.

In order to release any module 12 for removal, its companion terminal assembly 14 must be raised. This can only be done by shifting fingers 52a out of cooperation with terminal assemblies 14 so that fingers 52a overlie modules 12. Protrusions 50 prevent fingers 52a from moving out of position overlying modules 12 until a terminal assembly 14 being raised has been lifted to its fully raised position (assembly 14A in FIG. 6) wherein contacts 36c of the terminal assembly have been removed entirely from the paths followed by module contacts 28 as the module is being removed or installed. By like token, a module cannot be inserted while a terminal assembly is partially raised because fingers 52a obstruct the space where the module enters the enclosure, and protrusions 50 prevent fingers 52a from being shifted clear of the module path so long as terminal assembly 14 is raised partway.

Figure 4:
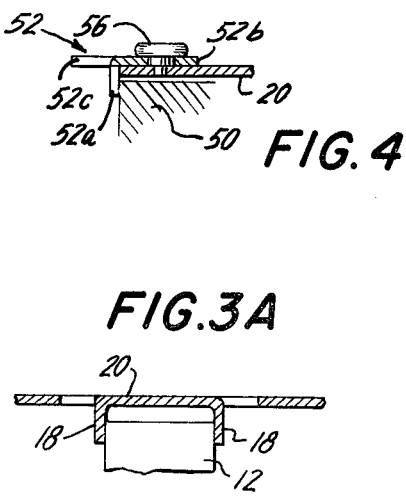
FIG. 4 is a fragmentary cross-section of the illustrative embodiment at the plane 4—4 in FIG. 1.
Figure 3A:
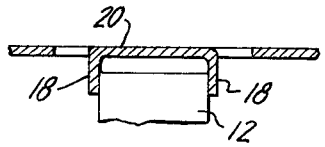
FIG. 3A is a fragmentary cross-section of the illustrative embodiment at the plane 3A—3A in FIG. 2.

Fingers 52a of each interlock 52 extend integrally from a slide 52b (FIGS. 3 and 4) that moves along the outside face of enclosure wall 20. Shouldered rivets 56 are fixed to wall 20 and move along slots 58 in slide 52b, for example. A finger piece 52c extending integrally from slide 52b is operable to shift fingers 52a out of or into the paths of protrusions 50. Any or all of terminal assemblies 14 become free to be lifted, and the related plug-in modules 12 can be freely inserted or removed only while interlock fingers 52a overlie or underlie protrusions 50.

After a terminal strip has been fully raised and interlocks 52 have been shifted so that their corresponding fingers 52a underlie protrusions 50 of the raised terminal assembly, the terminal assembly is locked against plugging-in movement. Screw terminals 32 can be loosened and tightened, without depressing the raised terminal assembly. This provides for stability while work is being done on the selected terminal assembly.

A circuit module cannot be removed while its terminal assembly is in its operating position because rib 38b of the terminal assembly overhangs the control module. Correspondingly, a control module cannot be installed in the enclosure while its companion terminal assembly is in its operating position because rib 38b then blocks the path of insertion of the circuit module. The circuit modules can only be removed or inserted when their companion terminal assemblies are in a fully raised position in which the contacts of the terminal assemblies have been shifted laterally out of the in-and-out paths of companion or mating contacts of the circuit module. Insertion and removal of circuit modules are thus unencumbered by friction of the mating contacts, and there is no danger of harm being caused to the resilient contacts of the terminal assemblies by forcible insertion of a circuit module while its companion terminal assembly is in its operative position, not raised out of that position. Moreover, the interlock holds down a circuit module while its companion terminal assembly is being pulled forward.

The interlock also provides assurance that contacts 36c are located safely out of the paths of contacts 28 which thus cannot touch contacts 36c while module 12 is being inserted. If a module 12 could be inserted while its terminal assembly 14 is raised only partway, certain contacts 28 at random might engage corresponding contacts 36c during insertion of the module while other contacts 28/36c remain disengaged, due to dimensional disparities. Circuit damage could occur. Engagement of contacts 28/36c during module insertion is prevented by the interlock.

With access limited to the front of the enclosure, the user can wire the terminal assemblies while they remain securely held in position, and he can install and remove the circuit modules with ease and in a manner that avoids damaging contacts of the terminal assemblies. The entire front area of the enclosure can be utilized by the circuit modules and their companion terminal assemblies.

Screw terminals 32 are shown exposed and accessible for tests that may become useful from time to time. Of course these terminals can be covered as by strips of insulation or by a bezel. Such protective provisions do not negate the characteristic availability of the terminals for test and for wiring and rewiring without need for access to the side or rear of the assembled apparatus.

The foregoing represents the presently preferred embodiment of the invention in its various aspects. As may be readily recognized, certain of the novel features may be used without others for their separate advantages and yet they are compatible and complementary. Various modifications may be made by those skilled in the art. Consequently the invention should be construed broadly in accordance with its true spirit and scope.

What is claimed is:

1. Electrical apparatus including an enclosure, at least one circuit module adapted to be inserted and removed from the enclosure, said circuit module and said enclosure having cooperating first guide means for constraining the circuit module to move along a prescribed in-and-out path for installation in the enclosure and removal, said circuit module having a plurality of module contacts at a side thereof, and a terminal assembly having a plurality of companion contacts at a side thereof disposed for mating with said module contacts, respectively, said apparatus having second guide means for constraining said terminal assembly to be moved along an in-and-out path that slants at an acute angle to the in-and-out movement of said circuit module such that, when the circuit module and the terminal assembly are in their operative positions, the module contacts are engaged by said companion contacts of the terminal assembly and, as said terminal assembly is drawn from its operative position outward along said slant angle, it attains a forward position wherein its companion contacts are separated from said module contacts and the circuit module can be removed from the enclosure and/or installed therein along its in-and-out path without engagement of the module contacts with the terminal assembly contacts.

2. Electrical apparatus in claim 1 wherein each mating pair of contacts comprising one of said module contacts and one of said companion contacts of the terminal assembly comprises a gripped contact and a pair of spaced-apart resilient contact elements arranged to have sliding and gripping contact with said gripped contact during the in-and-out movement of the terminal assembly.

3. Apparatus as in either claim 1 or 2 wherein said circuit module and said terminal assembly include cooperating formations constituting at least part of said second guide means and located adjacent the module contacts and the companion contacts for guiding said contacts into mutual sliding contact as aforesaid and for drawing said side of said terminal assembly toward said side of the circuit module as the terminal assembly is moved toward its operating position.

4. Apparatus as in either claim 1 or 2 wherein said enclosure and said terminal assembly have cooperating formations comprising at least part of said second guide means for enforcing in-and-out movement of said terminal assembly along its slant path.

5. Apparatus as in either claim 1 or 2 wherein said enclosure and said terminal assembly have cooperating formations comprising part of said second guide means for enforcing in-and-out movement of said terminal assembly along its slant path, and wherein said circuit module and said terminal assembly also include cooperating formations constituting part of said second guide means and located adjacent the module contacts and the companion contacts for guiding said contacts into mutual sliding contact as aforesaid and for drawing said side of said terminal assembly toward said side of the circuit module as the terminal assembly is moved toward its operating position.

6. Electrical apparatus as in claim 1 wherein a portion of said terminal assembly obstructs the circuit module against being moved outward when the circuit module and the terminal assembly are in their operative positions, the obstructing portion of the terminal assembly being out of the in-and-out path of the circuit module when the terminal assembly has been moved along said slant angle into said forward position thereof, whereby the obstructing portion of the terminal assembly when in its operative position also obstructs the path of insertion of a circuit module.

7. Electrical apparatus as in claim 6, further including an interlock operable between a first position arresting said terminal assembly in its operative position and a second position wherein the terminal assembly is free for outward movement, whereby said interlock when in said first position is also effective to prevent removal of said circuit module from its installed position.

8. Electrical apparatus as in either claim 1 or 6 including an interlock operable between a first position for arresting said terminal assembly in said forward position and a second position releasing the terminal assembly for in-and-out movement, said terminal assembly having screw terminals extending from said companion terminals, said screw terminals being accessible for wiring in the forward position of the terminal assembly.

9. Electrical apparatus as in claim 6, further including an interlock operable between a first position arresting said terminal assembly in its operative position and a second position wherein the terminal assembly is free for outward movement, whereby said interlock when in said first position is also effective to prevent removal of said circuit module from its installed position, said interlock when in its second position blocking the in-and-out path of a circuit module against insertion of a circuit module and against removal of an installed circuit module.

10. Electrical apparatus as in claim 1 or 2, further including an interlock operable into a first position in which it cooperates with said terminal assembly to prevent its movement out of either said operative position or said forward position, said interlock also being operable into a second position wherein said terminal assembly prevents movement of the interlock to its first position unless the terminal assembly is in either its operative position or its forward position.

11. Electrical apparatus including an enclosure, at least one circuit module adapted to be installed in said enclosure and removed therefrom via the front of the enclosure and having a plurality of contacts at a side thereof, said enclosure having first guide means for constraining the circuit module to move along a prescribed path during installation and removal, a terminal assembly alongside said circuit module in their operative positions in the enclosure, said terminal assembly having a plurality of companion contacts releasably mating with said circuit module contacts in said operative positions and being accessible from the front of the enclosure and movable forward of the circuit module while the latter remains fully installed, second guide means for constraining said terminal assembly to move bodily between said operative position and a position projecting forward of said circuit module when the latter is in its operating position, said terminal assembly including plural screw terminals accessible for wiring while the terminal assembly is in its forward position, means for connecting at least some of said screw terminals to said circuit module, and releasable means for holding said terminal assembly stably in its forward position to facilitate wiring the screw terminals.

12. Electrical apparatus as in claim 11 wherein said releasable holding means is also selectively cooperable with said terminal assembly for holding the latter in its operative position.

13. Electrical apparatus as in claim 12 wherein said releasable holding means is movable to a release position wherein the terminal assembly is movable between its operative position and its forward position and wherein said releasable holding means when in said release position obstructs said prescribed path of the circuit module so as to prevent removal of an installed circuit module and to prevent installation of a circuit module, said terminal assembly additionally having a portion blocking removal of an installed circuit module and insertion of a circuit module while said terminal assembly is in its operative position, whereby said releasable holding means is indirectly effective for blocking insertion and removal of a circuit module while the releasable holding means retains the terminal assembly in its operative position.

14. Electrical apparatus as in claim 1 wherein said enclosure has stationary plug-in contacts and said circuit module has plug-in contacts that mate with said stationary plug-in contacts when the circuit module is fully inserted into the enclosure.

15. Electrical apparatus as in claims 1 or 14 including additional circuit modules and terminal assemblies all as aforesaid, alternating in a row in close side-by-side assembly.

16. Electrical apparatus as in claim 1 wherein said terminal assembly has wiring terminals that are accessible for attaching wires thereto when the terminal assembly is in its forward position and are accessible from the front of the apparatus for test when said terminal assembly is in its operative position.

17. Electrical apparatus as in claim 11 or 16 wherein said terminal assembly includes a wiring gutter movable as a unit therewith.

18. Electrical apparatus as in claim 10 wherein said interlock when in said second position blocks the in-and-out path of the circuit module.

19. Electrical apparatus as in claim 12 wherein said releasable holding means includes a portion blocking the path of the circuit module while the releasable means is in position releasing the terminal assembly for in-and-out shift.

* * * * *